(12) United States Patent
Heon

(10) Patent No.: US 11,816,398 B2
(45) Date of Patent: *Nov. 14, 2023

(54) TRACKING CAD OBJECTS FOR REPORTING THEIR LOCATIONS WITHIN A CAD LAYOUT

(71) Applicant: EVOLVE MEP, LLC, Atlanta, GA (US)

(72) Inventor: Adam Heon, Atlanta, GA (US)

(73) Assignee: EVOLVE MEP, LLC, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/397,410

(22) Filed: Aug. 9, 2021

(65) Prior Publication Data
US 2021/0365604 A1    Nov. 25, 2021

Related U.S. Application Data

(63) Continuation of application No. 16/853,388, filed on Apr. 20, 2020, now Pat. No. 11,087,037.

(60) Provisional application No. 62/835,696, filed on Apr. 18, 2019.

(51) Int. Cl.
| | |
|---|---|
| *G06F 30/13* | (2020.01) |
| *G06F 30/12* | (2020.01) |
| *G06F 3/0484* | (2022.01) |
| *G06F 3/04845* | (2022.01) |
| *G06F 3/04842* | (2022.01) |

(52) U.S. Cl.
CPC .......... *G06F 30/13* (2020.01); *G06F 3/04842* (2013.01); *G06F 3/04845* (2013.01); *G06F 30/12* (2020.01)

(58) Field of Classification Search
CPC .. G06F 30/13; G06F 3/04842; G06F 3/04845; G06F 30/12
See application file for complete search history.

(56) References Cited

U.S. PATENT DOCUMENTS

| | | | |
|---|---|---|---|
| 10,664,772 B1* | 5/2020 | Poel | G06F 3/04842 |
| 2007/0038414 A1* | 2/2007 | Rasmussen | G06F 30/13 |
| | | | 703/1 |
| 2014/0035726 A1* | 2/2014 | Schoner | H04W 64/00 |
| | | | 340/8.1 |
| 2017/0339528 A1* | 11/2017 | Grönqvist | H04W 4/029 |
| 2018/0032649 A1* | 2/2018 | Buckman | G11B 5/012 |
| 2019/0347746 A1* | 11/2019 | Duncan | G06Q 10/063118 |
| 2020/0134560 A1* | 4/2020 | McLinden | G06T 17/05 |

* cited by examiner

*Primary Examiner* — Michael Le
(74) *Attorney, Agent, or Firm* — Clayton, McKay & Bailey, PC

(57) ABSTRACT

A plugin can allow for tracking objects within a computer-aided design ("CAD") application. In one example, the user can select an object or family of objects to track. The plugin can set a parameter of the tracker to match that of the selected object(s). The tracker can be joined to the selected object to form a new assembly, such as by embedding the tracker within the object. A user can define areas, such as rooms or floors, within the layout. The plugin can poll the trackers, which report which areas the corresponding object is within. The plugin can compile this information and display quantities of object types per area.

20 Claims, 5 Drawing Sheets

TRACKING CAD OBJECTS FOR REPORTING THEIR LOCATIONS WITHIN A CAD LAYOUT

CROSS-REFERENCE TO RELATED APPLICATION

This application claims the benefit of and priority as a continuation to U.S. Pat. No. 11,087,037, filed on Apr. 20, 2020, which is a nonprovisional of U.S. Provisional Application No. 62/835,696, filed on Apr. 18, 2019, titled "Tracking CAD Objects," the contents of which are hereby incorporated herein by reference in their entireties.

BACKGROUND

Computer-aided design ("CAD") software allows users to design structures for construction, among other things. One type of CAD software is Building Information Modeling ("BIM") software, which allows users to elaborately design three-dimensional structures. AUTODESK REVIT is one type of BIM software that can be used to design complex buildings all the way down to components and assemblies for use in a project. For example, a user can model an entire plumbing or electrical installation within a building.

Electrical contractors create CAD building models made of CAD objects that represent the building materials they will need to construct the project. For construction purposes, contractors often need to compile a list of all the materials grouped by their respective location within the model. For example, a contractor may need to know how many objects are in each room, area, or floor. When materials are delivered to a site, it can be important that they are moved to the correct location. Otherwise, much time can be lost simply sorting through materials or finding needed materials that have already arrived.

For example, a user normally has no mechanism of tracking conduit fittings. When they arrive onsite, it is not easy to know how many will be used in which areas. This can cause the fittings to get misplaced at the jobsite rather than delivered to the correct area. Similarly, rooms and floors can become cluttered with parts and materials that are not even destined for that particular area.

Currently there is no way of tracking CAD objects within their respective area. However, designers are stuck using existing CAD systems due to their popularity. Therefore, a need exists for improving existing CAD systems in relation to tracking CAD objects. Even more particularly, a need exists for systems that track the location of REVIT components.

SUMMARY

The examples described herein specifically address technical problems and limitations of REVIT and similar BIM software. The examples include a plugin that can operate with a CAD application through use of application programming interface ("API") calls. The plugin can allow for tracking CAD objects within areas, such as rooms or floors, of a design layout. The object can be a single component, such as a conduit fitting, or multiple components together in an assembly. This can allow workers to know how many of different parts and assemblies need to be sent to the corresponding areas of a construction site.

In one example, the user can select an object within the CAD application that does not report a location relative to a layout. The user can then add tracking to the object by selecting a tracking option generated by the plugin. In one example, the plugin can then cause the creation of an assembly where a tracker is joined to the object. The tracker can be a small piece of geometry within the CAD object. In one example, the tracker is not visible on screen and does not change the appearance of the object. The tracker includes functionality for reporting its location within the layout. For example, the tracker can have code that compares its location relative to location information of defined areas of the layout. The plugin can link the tracker to the object and save the assembly. In one example, the tracker can automatically create the assembly that includes the object and the tracker.

The creation of the assembly can include embedding a three-dimensional extrusion within the object, the three-dimensional extrusion being the tracker, wherein the tracker has a category that is set in relation to the object type. In one example, the tracker can be associated with an entire family of assemblies at once. For example, the e user can select a family and select an option to add tracking. The plugin can then add a parameter to the family that links the family to the tracker (e.g., it can embed the tracker within the assembly). This can cause any assembly in the family to include a tracker.

The plugin can set an object's tracker to have the same parameters for identification purposes. For example, a category ID (e.g., "hardware"), item description ("Channel nut stainless steel"), and object type ("fitting") can be copped over from the object parameters into the tracker parameters. This can allow the tracker to report back to the plugin as if it is the object.

The user can then place the object within the layout by selecting the object on the graphical user interface ("GUI"). For example, the user can locate the object in a list of objects and drag it onto the layout portion of the screen. The plugin can automatically provide the updated version of the object. In other words, the assembly with the object joined to the tracker can be placed into the layout. In one example, the plugin does this by maintaining a reference to the assembly based on having added a tracker to the object. In another example, the object is saved such that it refers to the assembly.

The user can define areas within the layout by selecting walls or floors and setting an area with the CAD application. The CAD application or the plugin can keep a list of these areas and their spatial boundaries.

The plugin can create a button for revealing tracked objects. When selected, the plugin can poll for tracked objects as part of reporting the location of the object. The tracker of each object can make an API call to ask the CAD application which area it is within. The tracker can receive identification of the area. Then the tracker can report an object ID, object type, and the area ID to plugin in an example. The plugin can receive reports from all of the trackers in an example. Then the plugin can group object types by areas or object IDs by area. This information, showing how many of each type of object is in each area, can be presented on the GUI as object type counts for one or more areas of the layout. By inserting a tracker (i.e., a trackable CAD object) within each electrical component and linking the electrical component information to tracker, users can quantify each electrical component by room, area, and/or floor location.

The GUI can also illuminate certain tracked objects in an example. These objects can appear with red dots within the layout when the user selects an option to show tracked objects.

The method can be performed by a system in an example. The method can also be implemented based on code stored on a non-transitory, computer-readable medium, which is read and executed by a process of a computing device.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

In an example, a plugin can allow for tracking objects within a CAD application. The objects can be individual components or assemblies of components. In one example, the user can select an object or family of objects to track. The plugin can set a parameter value of the tracker object ("tracker") to match a corresponding parameter of the selected object(s). This can allow the tracker to report to the plugin as if it is the object. The tracker can be joined to the selected object to form a new assembly, such as by embedding the tracker into the object, in an example. The tracker can have functions that request its relative location within the layout, such as by making an API call in the CAD application to ask which defined area it currently is within. This can allow the trackers to report object whereabouts with respect to areas in a design layout. The plugin can poll the trackers, compile the object whereabouts, and display quantities of object types per area. This can allow workers at a construction site to plan for the right number of assemblies and components in the right areas of the site.

Figure 1:
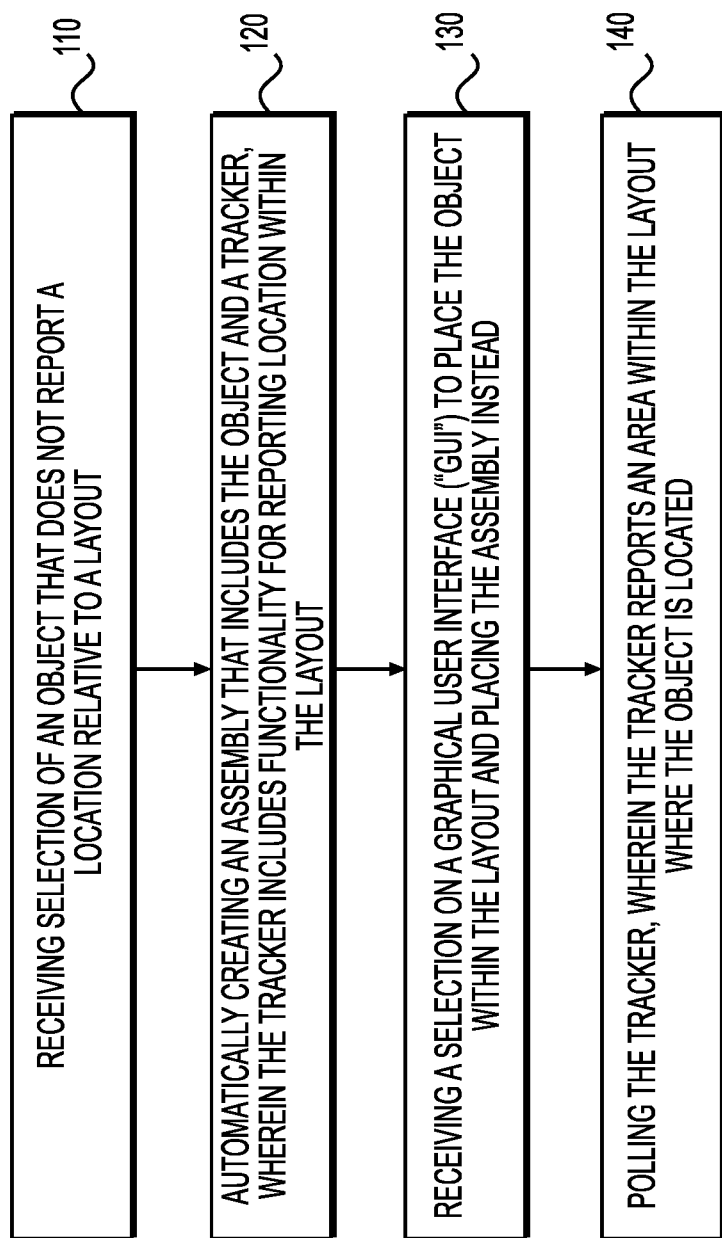
FIG. 1 is an example flow chart for a method for tracking CAD objects relative to an area in a design layout.

FIG. 1 is an example flow chart for a method for tracking CAD objects relative to an area in a design layout in a CAD application. At stage 110, the user can select an object for use within a design application, such as REVIT. The object can be a single part or an assembly of multiple parts. For example, the object can be a strut angle bracket, which can include a bracket, a bolt, a washer and a nut. Thousands of different objects can exist within the design application. The majority of them can be assemblies of multiple parts.

The object can be a normal CAD object. It does not natively have the ability to report its location relative to the design layout. For example, if the object is a bolt, it will be impossible to query the bolt to understand where within the layout the bolt exists.

At stage 120, a plugin that interacts with the CAD application can transform the object to give it tracking capabilities. To do so, the plugin can create an assembly that includes the CAD object and a tracker. The tracker can be another CAD object (i.e., element) that includes functionality for reporting its location within the layout.

In one example, the tracker is a small three-dimensional extrusion that is embedded within the object. This can allow the CAD object to retain its same appearance, connectors, and other attributes within the design layout. The resulting assembly of the object and tracker can be saved as a new version of the object in an example. Alternatively, the assembly can be separately saved, and the plugin can maintain a pointer to the assembly. This can ensure that the tracked version of the object is used within the design layout.

As part of linking the tracker to the object, the plugin can set parameters of the tracker to match those of the object. For example, the object can have an object ID, and object type, a category, or other such identifying information. The plugin can copy these parameter values from the object and set corresponding parameters of the tracker to have the same parameter values. This can allow the tracker to report to the plugin as if the tracker is the object, in an example.

In one example, the user causes the plugin to create trackable objects by selecting a tracking option that the plugin presents on the GUI. This can be a button or a menu item, depending on the example. In one example, the user can select an entire family of objects and choose the option add tracking. In that example, the plugin can iterate through the objects in the family and imbed trackers into those objects. This can include adding trackers to particular whitelisted or non-blacklisted parts. For example, one object in the family can be the aforementioned strut angle bracket assembly. Rather than add just one tracker, the plugin can add a tracker to the bold, the washer, and the bracket of the strut angle bracket assembly. This can allow for reporting numbers of parts within the tracked assembly. The bolt tracker, for example, can receive parameter values from the bolt object. The tracker imbedded in the washer can likewise receive washer parameter values. Some of these parameters can be the same. For example, both trackers can be part of an "electrical equipment" category.

A user can add objects to the design layout at stage 130. To do so, they can make a selection on the GUI to place the object within the layout, such as by dragging the object from a menu onto the layout portion of the screen. The object may have already been updated by the plugin to have an embedded tracker. In one example, objects that are already within the layout can be automatically updated to include one or more embedded trackers. When the tracker is linked to the object, the object (i.e., assembly) can be updated globally within the layout, in an example. In another example, the plugin maintains a pointer to a different assembly that includes the object and tracker. The plugin can then substitute the assembly in place of the object. But it is to be understood that the object can be saved as the updated assembly, making the assembly and the object one and the same.

At stage 140, the plugin can poll the tracker for the object's location. This can be part of a broader polling by the plugin, which can attempt to poll trackers for a particular category or all trackers in the layout. The plugin can make an API call to the CAD application in one example. Each tracker can be registered with the CAD application, which can maintain a list of trackers. Alternatively, the trackers can share an ID that the CAD application can locate for polling purposes.

The tracker can maintain spatial coordinates in one example. The CAD application or plugin can maintain a list of areas defined in the layout by the user. The coordinates of each tracker can be compared to the boundaries of the areas to determine which area each tracker is in. In one example, the tracker object can return its location to the CAD application. The CAD application can compare that location to the boundaries of the user-defined areas, such as rooms or floors. Then the CAD application can report the area back to the plugin, along with a tracker identifier, such as object ID, object type, or category. Because the parameter values of the tracker can mimic those of the corresponding object, the information received by the plugin can indicate the area where the object is located. In this example, the CAD application can report back to the plugin the area within the layout where the object is located and a parameter value pertaining to the object. The parameter value, for example, can indicate a strut angle bracket or can indicate a bracket, bolt, washer, or nut.

In an alternative example, the plugin can maintain a list of user-defined areas. The plugin can receive the spatial coordinates from each tracker and then determine which area the coordinates fall within. In that example, the tracker can report back the area by supplying coordinates that can be compared by the plugin against area boundaries.

Once the plugin has ascertained the locations of the objects with trackers, the plugin can present location breakdowns on the GUI. In one example, this can include presenting object type counts for an area of the layout based on the polling. For example, the GUI can list different areas with the same area type, such as rooms. For each room, the GUI can list how many of each category or type of object is present there. The user can make selections to focus on only particular object categories or types. For the purposes of this disclosure, categories and types are treated interchangeably. This can allow the user to easily determine how many of a particular object (assemblies and parts) should be present in each corresponding area at the jobsite. For example, the user can break down assemblies by floor, then on a particular floor, by room. This can allow for much more efficient delivery of materials for construction purposes.

Figure 2:
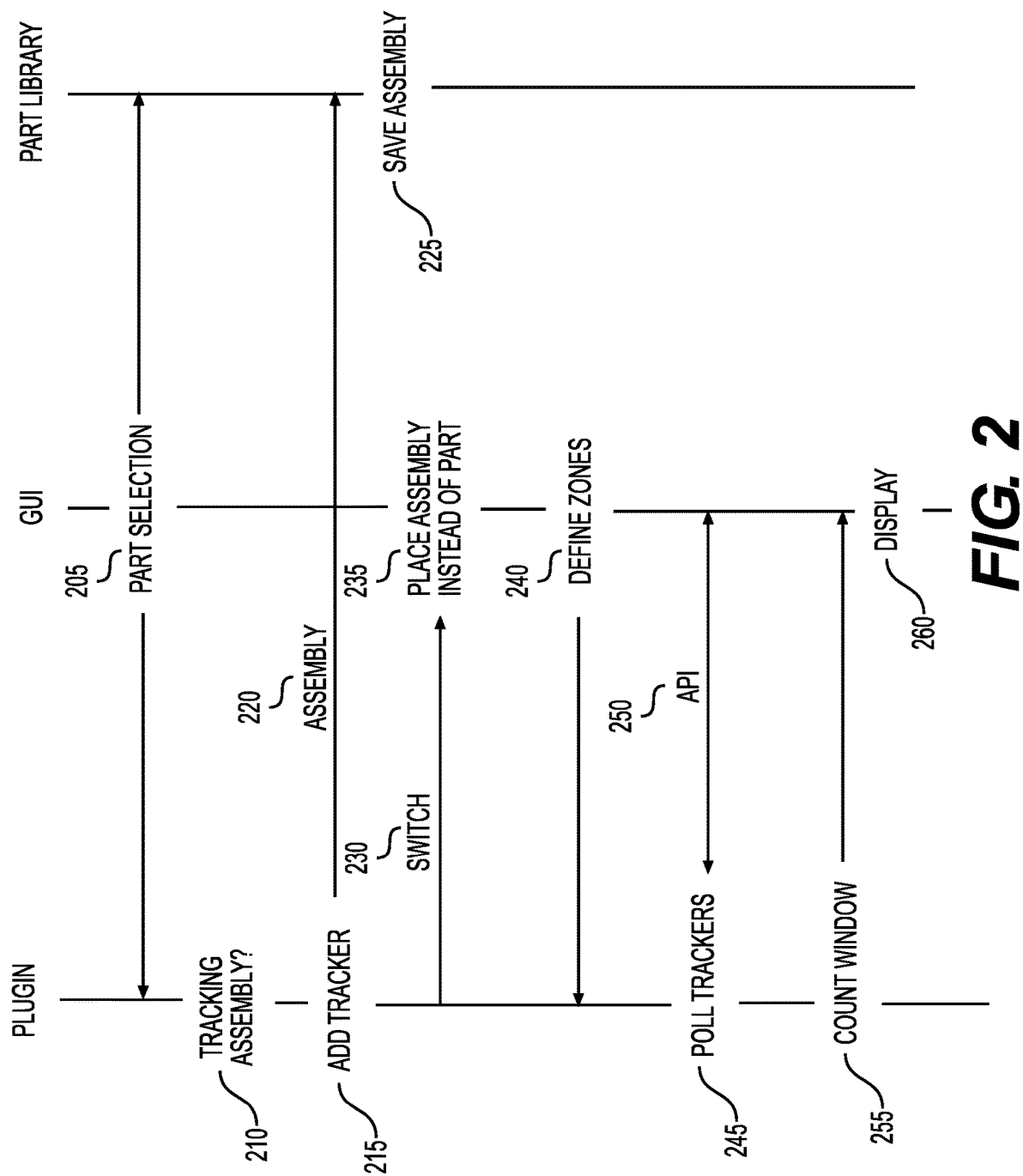
FIG. 2 is an example sequence diagram for tracking components in a CAD application.

FIG. 2 is an example sequence diagram for tracking components in a CAD application. At stage 205, the user can select a part (i.e., object) for tracking. This can include selecting an assembly with multiple parts, or a family of multiple assemblies. The selection can be made on a GUI of a CAD application, in an example. The parts can be retrieved from and stored in a part library. The part library can be maintained by the CAD application. However, a custom parts library is also possible. For example, the plugin can be part of an add-on suite that includes custom fabrication parts for mechanical or electrical applications.

At stage 210, the plugin can determine whether the selected part already includes a tracker. In one example, this can be an automated process where trackers are added to particular part categories or types as the parts are selected for use. Alternatively, this process can be started when the user selects an option to add tracking.

To associate the part with a tracker, the tracker can be added at stage 215. In one example, the tracker can be a small or invisible three-dimensional extrusion that is embedded within the part. The plugin can associate the tracker with the part, such as by adding the tracker to an assembly that the part belongs to. In another example, the part can include an attribute indicating an attached object. The plugin can change the attribute to refer to the tracker. In either case, for the purposes of this disclosure, the part can then be an assembly that includes both the part and tracker.

Adding the tracker can also include setting parameter values of the tracker to match some of those of the part. This can allow the tracker to report with a part identifier, a part type, or same category.

At stage 220, the assembly changes can be sent back to the part library, where they can be saved at stage 225. This can cause the layout to update existing parts based on the saved changes, switching to tracked assemblies at stage 235. For example, instances of the strut angle bracket that are already within the layout can be updated to include the tracker. In one example, this occurs based on the strut angle bracket instances all pointing back to the assembly in the part library, which gets updated at stage 225. Alternatively, the plugin can iterate through parts with the same ID as the part that was updated at stage 215 and switch parts at stage 230. This can include making an API call to replacing the old part with the new tracker-enabled assembly.

At stage 240, the user can define areas (i.e., zones) within the layout. In one example, the plugin provides this functionality, allowing the user to select rooms, floors, or define custom areas. In another example, the CAD application can have a mechanism for defining areas.

At stage 245, the plugin can poll the trackers to determine where the corresponding objects currently are within the layout. The polling can be done based on options provided by the plugin. For example, the user can select which categories or object IDs to poll. The user can also select which types of areas, such as floors, rooms, or custom to poll the trackers in relation to.

At stage 150, the plugin can make an API call to the CAD application. This can cause the CAD application to poll each tracker having parameters that match those specified by the plugin. For example, the user can select to poll for nuts, and the CAD application can poll trackers having an ID or type that corresponds to the nuts. The application can return tracker IDs along with location information. In one example, the CAD application can compare the spatial coordinates of the trackers to the area boundaries. In that example, the location information can be the are where the tracker is located. In another example, the CAD application can return the coordinates of each tracker meeting the polling criteria. In that example, the plugin can then compare those coordinates against area boundaries to determine which areas the trackers are in.

At stage 255, the plugin can generate a count window that breaks down where the polled tracked parts are within the layout. This can include, for example, listing floors or rooms with part counts per part ID, type, or category. The count window can be drawing on the GUI at stage 260 through the plugin making API calls to the CAD application.

Figure 3A:
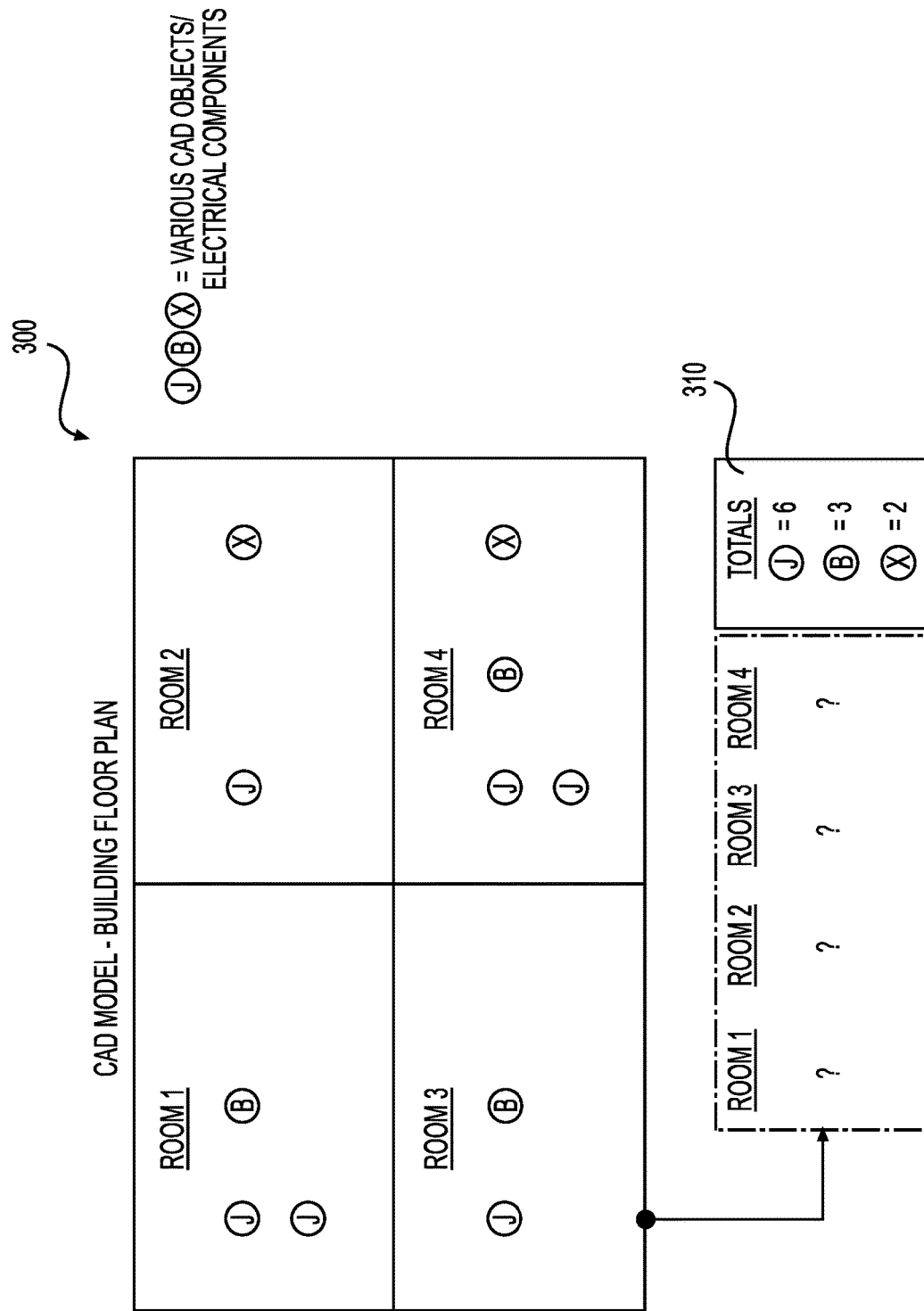
FIG. 3A is an example illustration of a layout within a GUI where the objects have no trackers.

FIG. 3A is an example illustration of a layout within a GUI where the objects have no trackers. Example screen 300 includes four rooms, labelled Room 1-4. In one example, the user can define these rooms, such as by selecting the wall boundaries and selecting an option to create an area. The areas and corresponding boundaries can be maintained by the CAD application as part of the layout file. Alternatively, the plugin can maintain a list of areas and boundary information.

In this example, objects J, B, and X are placed in various location within the layout 300. However, in an actual design layout, it would be difficult for the user to simply find and tally up the room counts for these objects. There could be hundreds of objects in a single room, for example, particularly with smaller parts like nuts and brackets.

Even if the CAD program could visualize a count display 310, without linking trackers to the objects at most the CAD program could count totals of each object J, B, X within the overall layout 300. In this example, that is shown as 6 instances of J, 3 instances of B, and 2 instances of X. But it is still unknown how these parts are dispersed per room.

Figure 3B:
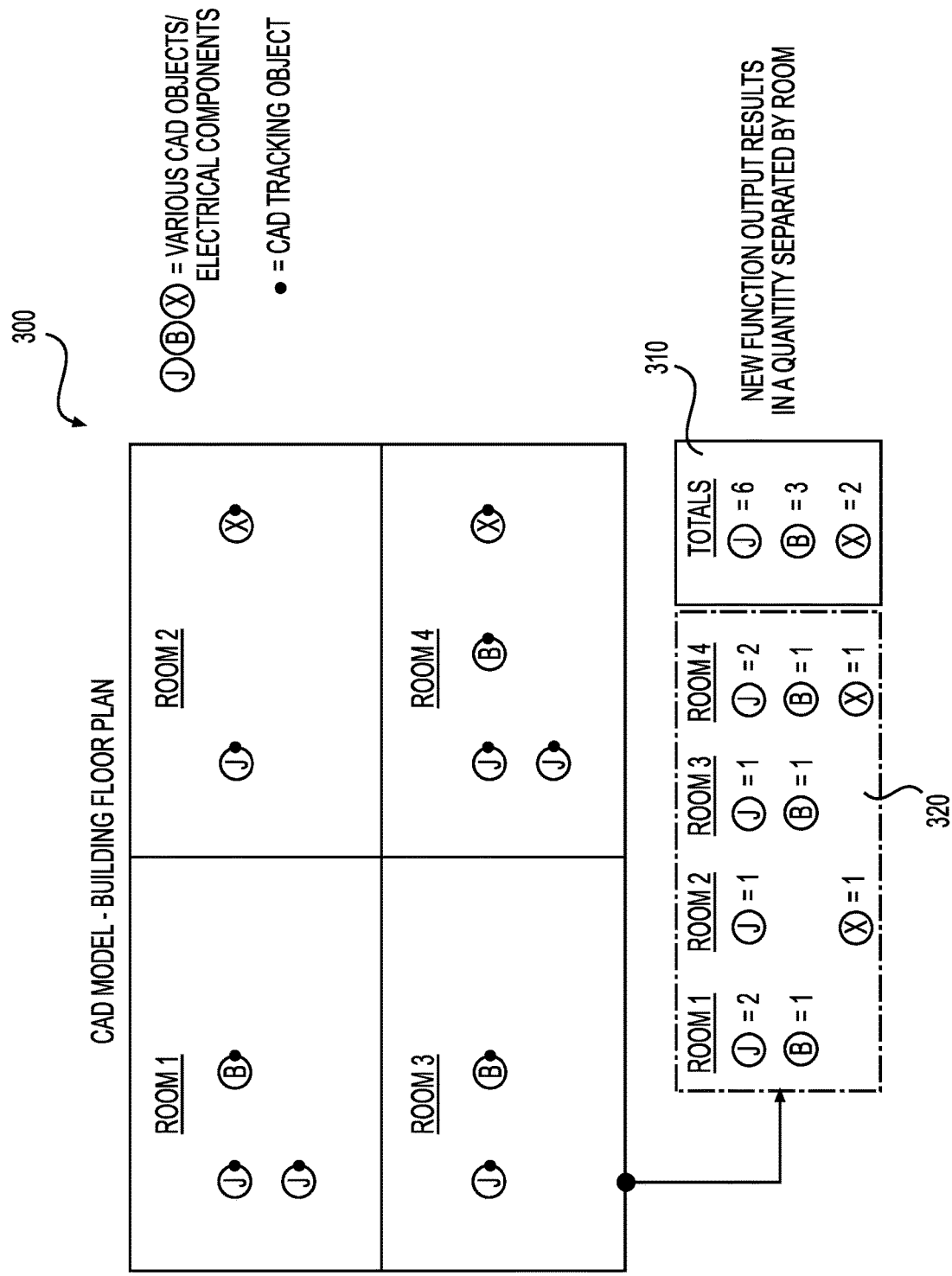
FIG. 3B is an example illustration of a layout within a GUI where the objects are linked to trackers.

FIG. 3B is an example illustration of a layout within a GUI where the objects are linked to trackers, such as through stage 215 of FIG. 2. In this example, the dot on the various objects J, B, X indicates the presence of a tracker. In one example, the user can toggle indicators on and off to see which objects are being tracked. The plugin can provide this toggle option, in an example. The objects can be identified with a red dot when visualization is toggled on. This can give a user peace of mind that the assemblies they are using are equipped with the tracker.

When the user selects a polling option provided by the plugin, the plugin can request location information from trackers in the layout. This can be for all trackers or limited to particular parts or categories.

In this example, the count display 310 can include a breakdown 320 per room of how many of each item type J, B, X is present in each room. In this example, the breakdown is in a table format with different object types J, B, X occupying different rows. The rooms can be columns. This can allow the user to quickly determine which rooms contain how many of which types of objects.

Although this example includes a per-room breakdown 320, other breakdowns 320 are possible. For example, the GUI could instead display a per-floor breakdown 320. The user can select any number of defined areas to display together. For example, the user can select rooms 1 and 2 and also floor 3. Similarly, the user can navigate criteria for which trackers to poll. The polling criteria can include a family, a part, a part type, part category information, and others.

Figure 4:
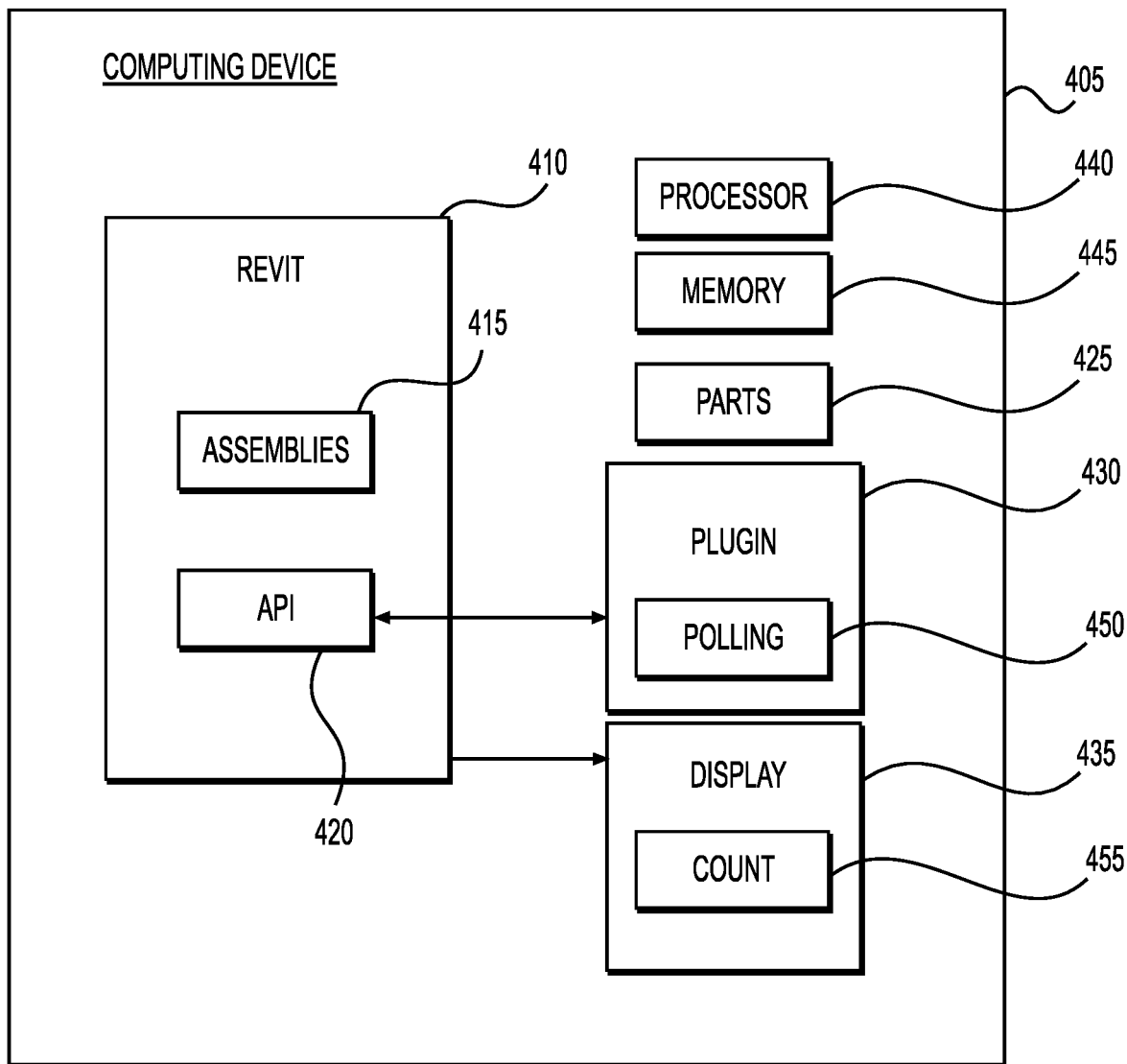
FIG. 4 is an example illustration of system components for use in tracking objects within a CAD application.

FIG. 4 is an example illustration of system components for use in tracking objects within a CAD application. The computing device 405 can be any processor-based device, such as a personal computer, workstation, server, phone, tablet or laptop. The computing device 405 can include a processor 440 and memory 445. The processor 440 can be one or more physical processors that are local to the computing device 405 or virtual computer processing units that are accessed remotely. The memory 445 can be non-transitory and can store instructions for execution by the processor 445.

The processor 440 can run a computer-aided design application, such as REVIT 410. REVIT 410 can include assemblies 415 of parts. These can be generic parts and assemblies. Alternatively, custom parts and assemblies 425 can be utilized.

REVIT 440 can also generate a GUI for use with a display 435. The display 435 can be any type of screen and can be integrated into the computing device 405 or separate from the computing device 405.

REVIT 440 can utilize the plugin 430 to add functionality discussed herein. The plugin 430 can make API 420 calls to REVIT to integrate itself within the workflow. This can include altering the GUI and providing additional functional items, such as menu items and buttons, for use with the CAD object tracking. The plugin 430 can receive information, such as part identifiers, from REVIT 410 and make changes to the assemblies. For example, the plugin 430 can add the tracker to existing assemblies 415. These can be stored by REVIT 410 or externally in a parts library 425.

The plugin 430 can also perform tracker polling 450 based on functions included within the plugin 430. For example, the plugin can provide a button to REVIT 410. REVIT 410 can notify a plugin function when the button is selected.

In one example, the plugin 430 can perform polling 450 based on object categories. For example, the plugin 430 can determine where all of the electrical parts are placed, per room. To do so, the plugin 430 can make an API 420 call to REVIT 410 to request a location of parts having a particular category that corresponds to tracked electrical parts. In one example, REVIT 410 can locate the trackers having that category parameter. Then REVIT 410 can return location information along with a part type or ID. The part type and ID of the trackers can mimic those of the linked objects. This can cause the trackers to report locations of assemblies 415, in an example.

In one example, REVIT 410 can also compare a location against a user-defined area. In another example, the plugin makes this comparison. In either case, the plugin 430 can receive the area where each tracked object is currently located.

The plugin 430 can make another API 420 call to cause the display 435 to show a count 455 of tracked objects. The count 455 can be object type per area, in an example. For example, each type of electrical assembly 415 can be counted per room. Then count 455 can display as a table breaking down how many of each assembly 415 are in each room.

Although a plugin is described in some examples, the computer-aided application, such as REVIT, can alternatively build the described functionality directly into the application. The examples can still apply to that scenario as well. Additionally, though REVIT is referred to for convenience, the examples can also function with any other computer-aided design application.

Other examples of the invention will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented are only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the invention being indicated by the following claims.

What is claimed is:

1. A method for tracking computer-aided design ("CAD") content, comprising:
   receiving selection of an object within a CAD application, wherein the object does not report a location within the CAD application relative to a layout, and wherein the object is at least one of a part or an assembly that can be used in the layout;
   linking the object to a tracker, wherein the tracker includes code that executes within the CAD application and is not a physical component of the CAD application, wherein the tracker includes functionality for reporting a location of the tracker within the layout in the CAD application;
   receiving a selection on a graphical user interface ("GUI") to place the object within the layout;
   polling the tracker within the CAD application, wherein the tracker reports an area within the layout where the object is located and a parameter value pertaining to the object; and
   presenting, on the GUI, object type counts for the area of the layout based on the polling.

2. The method of claim 1, wherein linking the object to the tracker includes updating the assembly to include the tracker, wherein the tracker is not visually represented on the GUI but the object is visually represented.

3. The method of claim 1, wherein the tracker is a three-dimensional extrusion embedded within the object, wherein the tracker has multiple parameters that a plugin sets to same values as corresponding parameters of the object.

4. The method of claim 1, wherein linking the object to the tracker occurs as part of assigning the tracker to a family, wherein the tracker is added to multiple assemblies within the family.

5. The method of claim 1, wherein the polling is performed by a plugin that operates with the GUI, wherein the plugin receives reports from multiple trackers, each report including the parameter value of the respective object.

6. The method of claim 1, wherein the tracker, in response to a polling instruction initiated by an application programming interface ("API") call from a plugin to the GUI, executes a function to determine which area the tracker is currently located in based on comparison of spatial coordinates of the tracker against boundaries of different areas of the layout.

7. The method of claim 1, wherein polling causes each of multiple trackers to report room locations, and wherein the GUI displays how many of first and second object types are present in multiple rooms.

8. A non-transitory, computer-readable medium containing instructions for tracking computer-aided design ("CAD") content, wherein a processor executes the instructions to perform stages comprising:
receiving selection of an object that does not report a location within a CAD application relative to a layout, wherein the object is at least one of a part or an assembly that can be used in the layout;
linking the object to a tracker, wherein the tracker includes code that executes within the CAD application and is not a physical component of the CAD application, wherein the tracker includes functionality for reporting a location of the tracker within the layout in the CAD application;
receiving a selection on a graphical user interface ("GUI") to place the object within the layout;
polling the tracker within the CAD application, wherein the tracker reports an area within the layout where the object is located and a parameter value pertaining to the object; and
presenting, on the GUI, object type counts for an area of the layout based on the polling.

9. The non-transitory, computer-readable medium of claim 8, wherein linking the object to the tracker includes updating the assembly to include the tracker, wherein the tracker is not visually represented on the GUI but the object is visually represented.

10. The non-transitory, computer-readable medium of claim 8, wherein the tracker is a three-dimensional extrusion embedded within the object, wherein the tracker has multiple parameters that a plugin sets to same values as corresponding parameters of the object.

11. The non-transitory, computer-readable medium of claim 8, wherein linking the object to the tracker occurs as part of assigning the tracker to a family, wherein the tracker is added to multiple assemblies within the family.

12. The non-transitory, computer-readable medium of claim 8, wherein the polling is performed by a plugin that operates with the GUI, wherein the plugin receives reports from multiple trackers, each report including the parameter value of the respective object.

13. The non-transitory, computer-readable medium of claim 8, wherein the tracker, in response to a polling instruction initiated by an application programming interface ("API") call from a plugin to the GUI, executes a function to determine which area the tracker is currently located in based on comparison of spatial coordinates of the tracker against boundaries of different areas of the layout.

14. The non-transitory, computer-readable medium of claim 8, wherein polling causes each of multiple trackers to report room locations, and wherein the GUI displays how many of first and second object types are present in multiple rooms.

15. A system for tracking computer-aided design ("CAD") content, comprising:
a processor that executes instructions for running a CAD application having an application programming interface ("API");
a memory that includes code for a plugin, the plugin interacting with the API to cause the processor to perform stages including:
receiving selection of an object that does not report a location within the CAD application relative to a layout, wherein the object is at least one of a part or an assembly that can be used in the layout;
linking the object to a tracker, wherein the tracker includes code that executes within the CAD application and is not a physical component of the CAD application, wherein the tracker includes functionality for reporting a location of the tracker within the layout in the CAD application;
receiving a selection on a graphical user interface ("GUI") to place the object within the layout;
polling the tracker within the CAD application, wherein the tracker reports an area within the layout where the object is located and a parameter value pertaining to the object; and
presenting, on the GUI, object type counts for an area of the layout based on the polling.

16. The system of claim 15, wherein linking the object to the tracker includes updating the assembly to include the tracker, wherein the tracker is not visually represented on the GUI but the object is visually represented.

17. The system of claim 15, wherein the tracker is a three-dimensional extrusion embedded within the object, wherein the tracker has multiple parameters that the plugin sets to same values as corresponding parameters of the object.

18. The system of claim 15, wherein linking the object to the tracker occurs as part of assigning the tracker to a family, wherein the tracker is added to multiple assemblies within the family.

19. The system of claim 15, wherein the polling is performed by the plugin, which operates with the GUI, wherein the plugin receives reports from multiple trackers, each report including the parameter value of the respective object.

20. The system of claim 15, wherein polling causes each of multiple trackers to report room locations, and wherein the GUI displays how many of first and second object types are present in multiple rooms.

* * * * *